(12) United States Patent
Gosian

(10) Patent No.: US 8,000,541 B2
(45) Date of Patent: Aug. 16, 2011

(54) QUANTIZATION DIFFERENCING COMPRESSION ALGORITHM

(76) Inventor: Gregory James Gosian, Pittsford, NY (US)

(*) Notice: Subject to any disclaimer, the term of this patent is extended or adjusted under 35 U.S.C. 154(b) by 528 days.

(21) Appl. No.: 12/221,226

(22) Filed: Oct. 28, 2008

(65) Prior Publication Data
US 2010/0104205 A1 Apr. 29, 2010

(51) Int. Cl.
*G06K 9/36* (2006.01)
*G06K 9/46* (2006.01)
(52) U.S. Cl. ........................................ 382/232
(58) Field of Classification Search .................. None
See application file for complete search history.

(56) References Cited

U.S. PATENT DOCUMENTS

| | | | | |
|---|---|---|---|---|
| 5,740,345 A | * | 4/1998 | Danielson et al. | 345/593 |
| 5,990,864 A | * | 11/1999 | DeAguiar et al. | 345/600 |
| 6,898,308 B2 | * | 5/2005 | Mojsilovic et al. | 382/162 |
| 6,983,074 B1 | * | 1/2006 | Clauson et al. | 382/244 |
| 7,212,676 B2 | * | 5/2007 | Dwyer et al. | 382/233 |

* cited by examiner

*Primary Examiner* — Yuzhen Ge
(74) *Attorney, Agent, or Firm* — Gregory Gosian

(57) ABSTRACT

The compression algorithm presented here is intended for the types of digital images acquired by solar system exploring spacecraft and missions, but can be utilized for all types of sequential data. It is lossy, but results in images whose Peak Signal to Noise Ratio remains in excess of 30 decibels, considered to be the threshold of being indistinguishable from the original image.

Currently employed spacecraft compression algorithms are probabilistic, and are costly in terms of spacecraft weight, power, computation, memory and volume requirements.

The algorithm submitted is non-probabilistic, requires less than 1 kilobyte of programming and memory space for computations, has low power and weight requirements, and can reside on a single Application Specific Integrated Circuit (ASIC), and.

It processes utilizing addition and comparison only—no advanced numerical solution generation, function generation by series expansion, or other mathematical processing is required.

5 Claims, 8 Drawing Sheets

FIG 1

| Difference Value | Encoded Decimal Codeword | Encoded Binary Codeword |
|---|---|---|
| -2 | 0 | 000 |
| -8 | 1 | 001 |
| -32 | 2 | 010 |
| -128 | 3 | 011 |
| 2 | 4 | 100 |
| 8 | 5 | 101 |
| 32 | 6 | 110 |
| 128 | 7 | 111 |

FIG 2

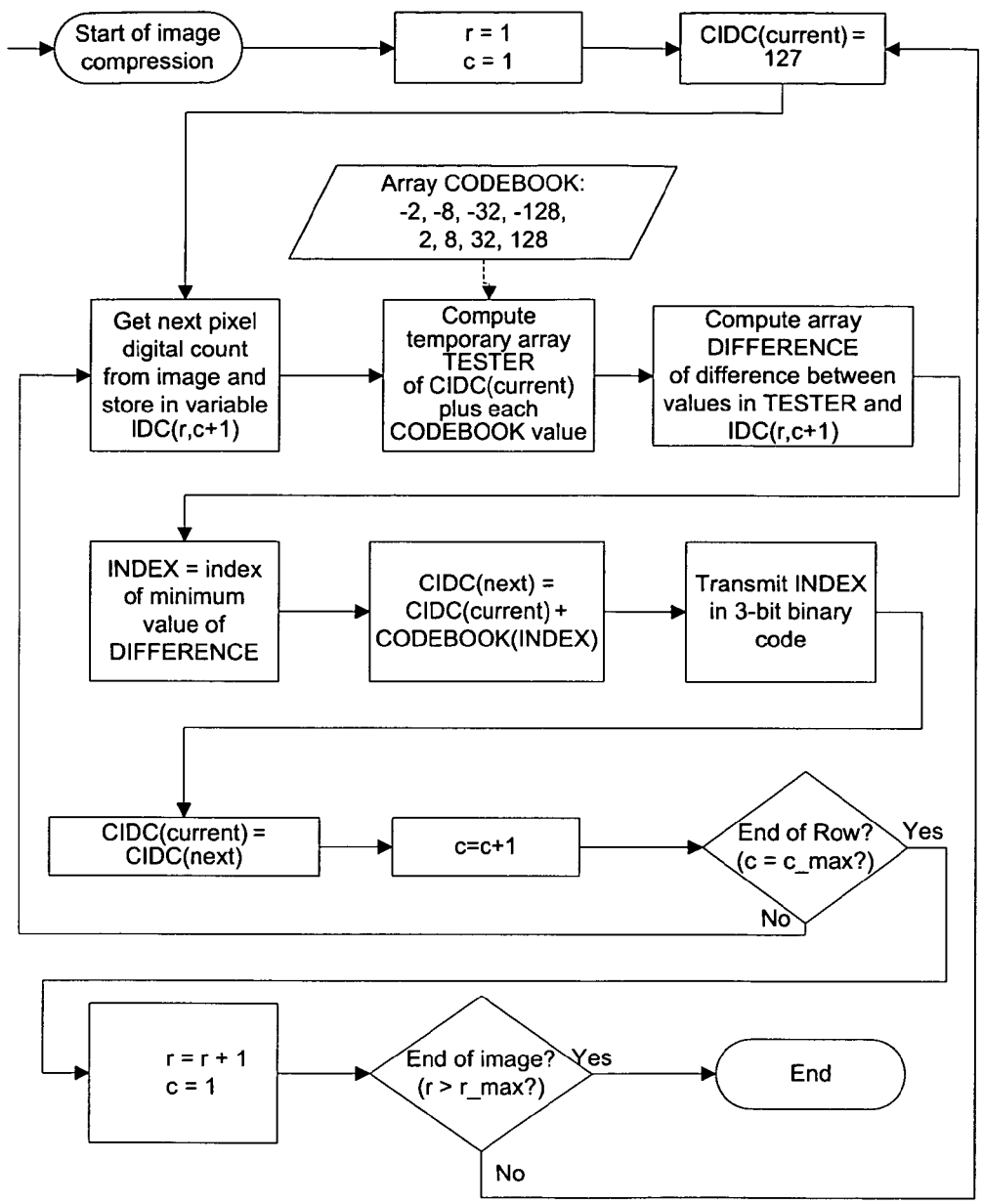

Variable list for compression r – row index
r_max - maximum number of rows
c – column index
c_max - maximum number of columns
CIDC(current) – current compressed image digital count at row r, column c
CIDC(next) – next compressed image digital count at row r, column c+1
IDC(r,c+1) – original non-compressed image digital count at row r, column c+1
CODEBOOK – 8 element data storage array of all codebook values
TESTER – temporary 8 element computation array; calculated by
   adding CIDC(current) to each element in CODEBOOK.
DIFFERENCE – temporary 8 element computation array; calculated by
   subtracting IDC(r,c+1) from each element in TESTER.
INDEX – index of minimum value of DIFFERENCE array

FIG 3

| Pixel number | 0 | 1 | 2 | 3 | 4 | 5 | 6 | 7 | 8 | 9 | 10 | 11 |
|---|---|---|---|---|---|---|---|---|---|---|---|---|
| Original Image DC (arbitrary values) | 180 | 180 | 190 | 189 | 189 | 188 | 160 | 22 | 21 | 18 | 18 | 19 |
| Encoded Image DC | 127 (starting value) | 159 | 191 | 189 | 187 | 189 | 157 | 29 | 21 | 19 | 17 | 19 |
| Original Image DC - Encoded Image DC | 53 | 21 | -1 | 0 | 2 | -1 | 3 | -2 | 0 | -1 | 1 | 0 |
| Codebook Value closest to difference | 32 | 32 | -2 | -2 | 2 | -32 | -128 | -8 | -2 | -2 | 2 | -2 |
| Encoded image DC + Closest Codebook Value (becomes next pixel's Encoded Image DC) | 159 | 191 | 189 | 187 | 189 | 157 | 29 | 21 | 19 | 17 | 19 | 17 |
| Transmitted word (binary coded Codebook Value) | 110 | 110 | 000 | 000 | 100 | 010 | 011 | 001 | 000 | 000 | 100 | 100 |
| Residual difference (between Encoded Image DC and Original Image DC) | 21 | 1 | 0 | 2 | 1 | 3 | 7 | 0 | 1 | 1 | 0 | 2 |

Variable list for decompression r – row index
r_max - maximum number of rows
c – column index
c_max - maximum number of columns
DIDC(r, c) – decompressed image digital count at row r, column c
DIDC(r, c+1) – decompressed image digital count at row r, column c+1
CODEBOOK – 8 element data storage array of all codebook values

FIG 5

| Pixel number | 0 | 1 | 2 | 3 | 4 | 5 | 6 | 7 | 8 | 9 | 10 | 11 |
|---|---|---|---|---|---|---|---|---|---|---|---|---|
| Received codeword | | 110 | 110 | 0 | 0 | 100 | 10 | 11 | 1 | 0 | 0 | 100 |
| Decoded Codebook Value | | 32 | 32 | -2 | -2 | 2 | -32 | -128 | -8 | -2 | -2 | 2 |
| Decompressed Image DC (added to next pixel's Decoded Codebook Value to become next pixel's Decompressed Image DC) | 127 (starting value) | 159 | 191 | 189 | 187 | 189 | 157 | 29 | 21 | 19 | 17 | 19 |
| Original Image DC | 180 | 180 | 190 | 189 | 189 | 188 | 160 | 22 | 21 | 18 | 18 | 19 |

FIG 7

| Pixel digital count bits | | Codeword bit assignment | | | | | | | | |
|---|---|---|---|---|---|---|---|---|---|---|
| | | 8 bits | 9 bits | 10 bits | 11 bits | 12 bits | 13 bits | 14 bits | 15 bits | 16 bits |
| Bit | Value | | | | | | | | | |
| 0 | 1 | | bit 1 - | | bit 1 - | | bit 1 - | | bit 1 - | |
| 1 | 2 | bit 1 - | | bit 1 - | | bit 1 - | | bit 1 - | | bit 1 - |
| 2 | 4 | | bit 1 + | | bit 1 + | | bit 1 + | | bit 1 + | |
| 3 | 8 | bit 1 + | | bit 1 + | | bit 1 + | | bit 1 + | | bit 1 + |
| 4 | 16 | | bit 2 - | | bit 2 - | | bit 2 - | | bit 2 - | |
| 5 | 32 | bit 2 - | | bit 2 - | | bit 2 - | | bit 2 - | | bit 2 - |
| 6 | 64 | | bit 2 + | | bit 2 + | | bit 2 + | | bit 2 + | |
| 7 | 128 | bit 2 + | | bit 2 + | | bit 2 + | | bit 2 + | | bit 2 + |
| 8 | 256 | | bit 3 - | | bit 3 - | | bit 3 - | | bit 3 - | |
| 9 | 512 | | | bit 3 - | | bit 3 - | | bit 3 - | | bit 3 - |
| 10 | 1024 | | | | bit 3 + | | bit 3 + | | bit 3 + | |
| 11 | 2048 | | | | | bit 3 + | | bit 3 + | | bit 3 + |
| 12 | 4096 | | | | | | bit 4 - | | bit 4 - | |
| 13 | 8192 | | | | | | | bit 4 - | | bit 4 - |
| 14 | 16384 | | | | | | | | bit 4 + | |
| 15 | 32768 | | | | | | | | | bit 4 + |
| | | | | | | | | | | |
| sign bit | | bit 3 | bit 4 | bit 4 | bit 4 | bit 4 | bit 5 | bit 5 | bit 5 | bit 5 |
| unused 1/2 bits | | none | one | one | none | none | one | one | none | none |
| # bits/code word | | 3 | 4 | 4 | 4 | 4 | 5 | 5 | 5 | 5 |
| resolution (bits) | | 2 | 1 | 2 | 1 | 2 | 1 | 2 | 1 | 2 |
| Compression ratio if 3, 4 or 5 bits used | | 8:3 | 9:4 | 10:4 | 11:4 | 12:4 | 13:5 | 14:5 | 15:5 | 16:5 |
| | | 2.67 | 2.25 | 2.50 | 2.75 | 3.00 | 2.60 | 2.80 | 3.00 | 3.20 |
| Compression ratio if only 3 most significant bits used | | 8:3 | 9:3 | 10:3 | 11:3 | 12:3 | 13:3 | 14:3 | 15:3 | 16:3 |
| | | 2.67 | 3.00 | 3.33 | 3.67 | 4.00 | 4.33 | 4.67 | 5.00 | 5.33 |

FIG 8

$$MSE = \frac{\sum_{i=1}^{N_R}\sum_{j=1}^{N_C}(f_{ij} - \hat{f}_{ij})^2}{N_R N_C}$$

$$PSNR = 10 \cdot \log \frac{(2^n - 1)^2}{MSE}$$

$f_{ij}$ = DC of pixel in original image $\hat{f}_{ij}$ = DC of pixel in decompressed image $N_C$ = number of pixel columns $N_R$ = number of pixel rows $n$ = bits per pixel in original image

QUANTIZATION DIFFERENCING COMPRESSION ALGORITHM

CROSS-REFERENCES TO RELATED APPLICATIONS

Provisional Application for Patent Cover Sheet
application Ser. No. 60/926,088
Filing date: 2007-04-25
Applicant: Gregory James Gosian
Title: "Non-probabilistic, preprocessing or stand-alone image compression algorithm suitable for deep space solar system mission image transmission"—(author's note—title has been changed in this application for a non-provisional patent, to more accurately reflect the invention's purpose and how it functions)

STATEMENT REGARDING FEDERALLY SPONSORED RESEARCH OR DEVELOPMENT

Not applicable

REFERENCE TO SEQUENCE LISTING, A TABLE, OR A COMPUTER PROGRAM LISTING COMPACT DISC APPENDIX

Not applicable

BACKGROUND OF THE INVENTION

1. Field of the Invention
Primary—Digital Image Compression
Secondary—Digital Data Compression
2. Description of the Related Art Digital Image Compression is a method of reducing the amount of numerical data required to describe a digitally acquired image. The advantage is that the resources (e.g., time, computer memory storage) required to transmit image from one location to another, or to store the image, is reduced.

One type of image compression algorithm allows for an identical copy of the original image to be reconstructed upon data decompression (called "lossless compression" since no data from the original image is irretrievable). Another type of algorithm does not recreate the original image identically, but the human viewer is unable to discern any difference between the original and the reconstructed images (called "lossy compression" since some data from the original image is lost forever).

BRIEF SUMMARY OF THE INVENTION

The objective of this invention is to create a lossy compression algorithm that is non-probabilistic (does not rely on processing the entire data set to achieve compression), is compact in terms of required computer memory, processing operations and required electronic hardware, and when used to compress digitally acquired images will reproduce the image with a peak signal to noise ration in excess of 30 dB (the threshold of being indistinguishable from the original image).

The individual values in a sequence of m-bit word data points span the range of from 0 to $2^m-1$. In such a range, the absolute value of the differences between adjacent data points can also range from range 0 to $2^m-1$. The number of discrete values the differences can assume is $2^m$. Quantization Differencing Compression works by approximating the differences between each adjacent pair of data points, with a set of $2^n$ discrete values, where n<m. For certain data streams, such as image pixel digital counts (DC), the human visualization (perception) system is unable to detect that the value of the differences between adjacent data points in the data stream reassembled from the encoded differences, is not an exact reproduction of the original data stream. The compression comes about because n<m, and so the number of bits required to encode this type of representation of the original data, is smaller.

BRIEF DESCRIPTION OF THE SEVERAL VIEWS OF THE DRAWINGS

FIG. 1—3-bit Encoding Codebook
FIG. 2—Compression Flowchart
FIG. 3—Example of compression encoding scheme for an arbitrary row in an image
FIG. 4—Decompression Flowchart
FIG. 5—Example of compression decoding scheme for an arbitrary row in an image
FIG. 6—Comparison of Values of original data and compressed/decoded data
FIG. 7—Extrapolated table of codebook values for data repersented by 8 to 16 bits
FIG. 8—Equations for determining Peak Signal to Noise Ratio (PSNR)

DETAILED DESCRIPTION OF INVENTION

Introduction

Figure 4:
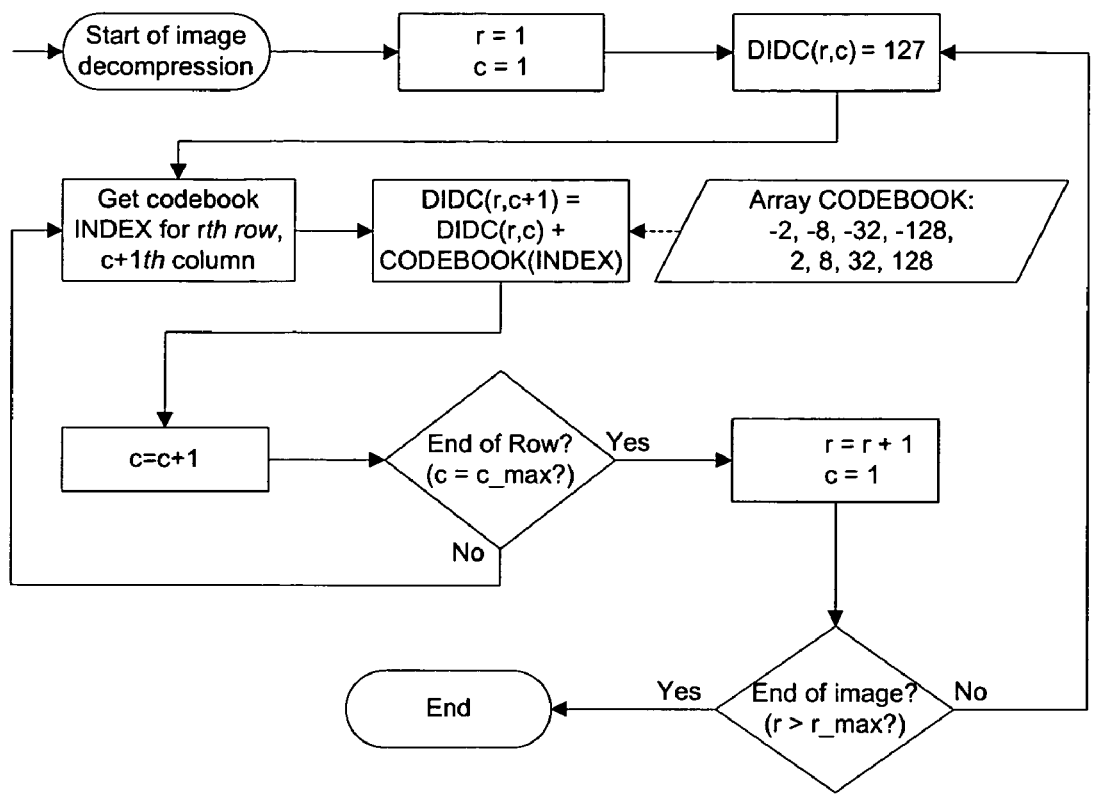

Interplanetary space probes have been launched to all points in the solar system since late 1959 when the Union of Soviet Socialist Republic's Luna 3 took the first photo of the far side of the moon. Though doing so in the proximity of their targets, these probes still are essentially remote sensing missions. As such, transmission of imagery back to Earth is one of the primary means of relaying data to the mission science teams. However, data transmission over such long distances remains problematic. Greater distance from the Earth demands slower bit rates in transmission to minimize errors. Any means of shortening the data stream enhances the probe's performance, and allows broader mission objectives to be achieved over the lifetime of the spacecraft. Image compression is one method to reduce the data stream. NASA's Galileo mission to Jupiter was saved from complete failure by employing data stream compression.

Since the advent of digital image acquisition, compression algorithms such as Huffman encoders, Integer Cosine Transforms (a variant of JPEG compression), Integer Wavelet Transforms (a variant of JPEG 2000 compression), Arithmetic Encoders, or combinations thereof, have been employed. Some of the problems associated with such probabilistic schemes is that there is a weight, power, and volume penalty with respect to the electronics that must be carried on-board to perform the compression. They are computationally and memory intensive.

A newly developed lossy compression algorithm known as Quantization Differencing Compression is presented that will prove useful in speeding initial image transmission, to facilitate selection of images and places of interest to be further examined with higher resolution and alternative longer data stream/lossless compression algorithms. This compression algorithm also has the advantage of being non-probabilistic, non-computational and non-memory intensive. The compression can be performed by an application specific integrated circuit (ASIC) that can reside on the camera's sensor electronics board; it would be a lightweight and require low-power. It can function as a stand alone compressor, or it can function as a back-up or pre-processor to more complex and hardware intensive compressors.

Quantization Differencing Compression was originally intended for image compression. Images contain inter-pixel redundancy; statistically, a pixel doesn't vary appreciably from its neighbor. Images reconstructed (decompressed) utilizing Quantization Differencing Compression typically do not present artifacts detectable by observers. Though Quantization Differencing can be utilized for any data stream, even those that are not associated with images, it is an example of image compression that will be utilized to illustrate how the algorithm works.

Algorithm Description

Quantization Differencing compression is designed to reduce the transmission of a fixed m-bit word (primarily used to describe digital counts for a panchromatic image or for each channel of a Red-Green-Blue image), to a fixed n-bit code word, with n<m. The algorithm is lossy but still results in images whose features remain recognizable by astronomical subject matter experts, and does so without creating artifacts that detract from the true scientific information content.

As the name implies, Quantization Differencing employs quantization. But prior efforts to implement quantization focused on digital count quantization. The bits representing the DC of each individual pixel was reduced in count through decimation. Typically lower significance pixels were merely dropped. However, since this caused a reduction in the number of available gray-levels, images suffered from an effect known as "contouring." Regions of fine gray-level gradients were represented by one DC value. Significant discontinuities in DC value where one region abutted another were prominent. Images took on a "paint-by-numbers" or cartoon look.

Additionally, the name "Quantization Differencing" implies that the algorithm is a differencing scheme. Information is transmitted to additively modify the preceding pixel's digital count, to arrive at the current pixel's digital count during the decompression stage. It does not reduce the available gray levels, but it does limit the available values of the differences in DC between adjacent pixels. Based on numerical analysis, this does not usually present a problem for the observer as most images compressed with this algorithm attain PSNRs greater than 30 dB, the threshold of indistinguishability from the original, uncompressed image.

In the 8-bit domain, any pixel's DC value can be described by an 8 bit word. To transmit the image, one could send the pixel data as a succession of DC values; each 8-bit value would be sent serially after the transmitter and receiver agree on the format for reconstruction of the 2-dimensional array of values.

Instead of transmitting each pixel's 8-bit gray-level value, the value of the difference between the $(k+1)^{th}$ pixel's DC and the $k^{th}$ pixel's DC is transmitted. The transmitted differences, the deltas, can range from −255 to +255. As long as the transmitter and receiver agree on a method of establishing the DC value of the very first pixel, then adding or subtracting the differences to each $k^{th}$ pixel can recreate the $(k+1)^{th}$ pixel. The entire image, with the exception of the first few pixels, can be accurately reconstructed (in actual practice, it is sensible to apply the entire process to some starting value to each row of pixels, to mitigate data corruption and error generation by providing a "per-row DC value reset").

The heart of Quantization Differencing is that it limits the representation of differences between adjacent pixel DC values to a power of 2. Consider an 8-bit, 256 gray-level image. The algorithm considers the 8-bit word describing the difference in DC values to be a bank of 8 "switches." But it allows only one of those 8 bits to be "switched" at a time (it will be shown later that the algorithm can be expanded to work in any sized bit-domain).

In 8-bit binary words, each bit represents a power of 2; the DC values are represented in binary as such:

128—10000000
64—01000000
32—00100000
16—00010000
8—00001000
4—00000100
2—00000010
1—00000001

It is appropriate to consider the following with respect to target images. Again, the concepts are considered in the 8-bit pan-chromatic domain, but will be applicable in any m-bit image. For this algorithm, it is necessary to first create the codebook that will be utilized:

Scalar differences in digital count values of 1 or smaller, across regions of nearly equal DC value, need not be accommodated. Such small deltas are insignificant due to the relative insensitivity of the human visual system (HVS) to these small changes in areas of constant brightness. As such, a delta of 1 can be dismissed. Similarly, for regions of constant digital count value, a delta of 0 can be dismissed. The algorithm will allow transmission of a relatively small delta so as to reconstruct the image where adjacent pixel DC values "oscillate" in a very narrow brightness range around their target DC value This accommodation allows setting the lower limit of the smallest delta at a value of 2.

Scalar differences in digital count values of (close to) 255 must be accommodated and made to be an available delta value. An image with bright content immediately adjacent to dark content (such as the white limb of a planet against a black background, or bright surface adjacent to shadow) is a typical locus in an image requiring so great a step. Since a delta of 128 is the maximum available value by selection of a single bit in the 8-bit word, so great a jump in DC value can be accomplished by utilizing byte-arithmetic, and wrap-around under byte arithmetic rules.

For example, tracking a DC of 3 in the $k^{th}$ pixel, to a DC value of 250 in the $k+1^{th}$ pixel can be accomplished by subtracting 8 from 3. Under integer arithmetic rules, that would normally equal −5. Since byte arithmetic doesn't allow for numbers outside of the range represented by the byte, the full value of 255 is either successively added or subtracted to −5 until the result is within the range of the byte; 0<=result<=255. For this example, 255 is added to −5 and the result is 250.

Thus, 128 is selected at one end of the scale for available deltas, and 2 at the other end. These two values can be encoded with a single bit with two states (0 and 1).

The remaining single bit binary values between 128 and 2 are: 64, 32, 16, 8, and 4. Skipping every other value between 128 and 2, the values of 32 and 8 are chosen as delta values for the codebook, consuming a second bit with two states. This evenly divides the selected bits among the 8 bits available:

128—10000000
32—00100000
8—00001000
2—00000010

Quantization Differencing considers the 8-bit word describing the difference in DC values to be a bank of 8 "switches," but it allows only every other "switch" as a selection.

As this is a differencing algorithm, it will add or subtract. Therefore a third bit is required to carry sign. One state to represent a "+", the other state to represent a "−".

The codebook is thusly created, and the 8 bits we might have used to represent all values from 0 to 255, are reduced to 3 bits, as shown in FIG. 1.

Algorithm Methodology

Compression—encoding, and transmission or storage

With the codebook determined, the compression and decompression algorithm is as follows. For illustration purposes, an example of 8-bit to 3-bit encoding for a pan-chromatic digital image is presented:

1. The first pixel in each row of the image is assigned an encoded DC value of $2^{(m-1)}-1$. In this case, $2^{(8-1)}-1$, or 127 (regardless of what the actual value is), for the encoding and decoding stages. The value is irrelevant as long as the transmitter and receiver agree on the starting value.
2. For the next and each successive pixel in the sampled image, the residual difference between the original image's $(k+1)^{th}$ pixel's DC value and the encoded image's $k^{th}$ pixel's DC value is calculated, according to the following formula:

Residual difference=$DC(\text{original})_{n+1}-DC(\text{encoded})_n$

3. A determination is made as to which of the code book values available is closest to the residual difference, and can be added to the $n^{th}$ encoded image pixel's DC to bring it as $DC(\text{encoded})_{n+1}=DC(\text{encoded})_n+\text{codebook value}_n$ close as possible to the original image's $k+1^{th}$ pixel's DC value:

4. The encoded word representing the added value is transmitted in binary (according to Table 1) to the receiver.
5. Steps 2 through 4 are repeated for each pixel across every pixel row of the image.
6. Steps 1 through 5 are repeated for all rows of the image.

FIG. 2 represents the flowchart of the encoding. FIG. 3 represents an example of how the first several pixels from a particular row in an image: are encoded.

Decompression—reception or retrieval, and Decoding

The decompression algorithm is applied as follows for the first pixel row:

1. The receiver sets the first pixel (in each row) DC count in the row to be decoded to of $2^{(m-1)}-1$. In this case, $2^{(8-1)}-1$, or 127.
2. The receiver adds the value of the decoded binary word to this first pixel's DC value, $DC(\text{decoded})_{n+1}=DC(\text{decoded})_n+\text{codebook value}_n$ and makes this the next pixel's DC value.

3. The receiver continues to add the value determined by each successively received encoded binary word received to the $k^{th}$ pixel DC in his image, to reconstruct the $(k+1)^{th}$ pixel DC.
4. Steps 1 through 3 are repeated for the remaining pixels in the row.
5. Steps 1 through 4 are repeated for all rows.

Figure 6:
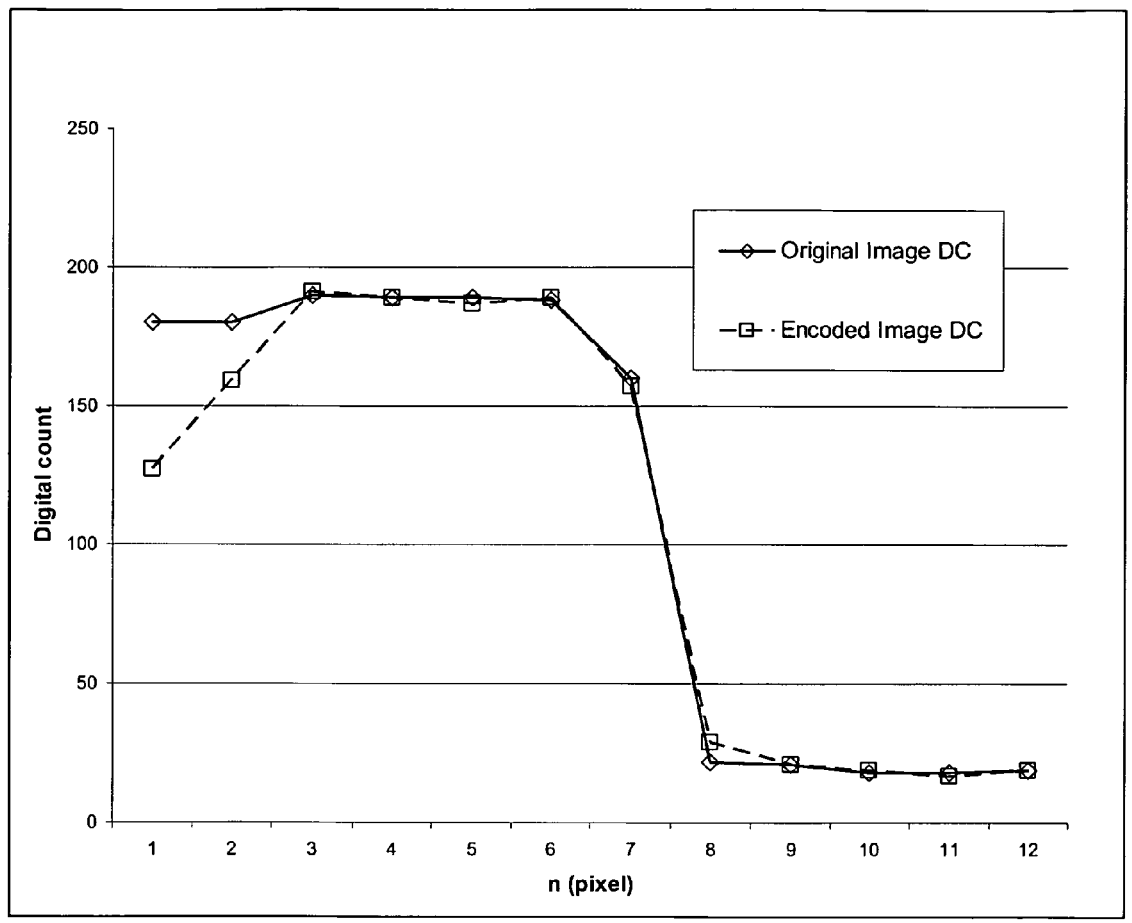

FIG. 4 represents the flowchart of the decoding. FIG. 5 represents an example of how the first several pixels from a particular row in an image: are decoded, and the data reconstructed. FIG. 6 show a comparison of the actual original data set of the first several pixels of the example, and the approximation to that original data set as generated by the Quantization Differencing algorithm.

Performance Verification and the Expanded Series of Encoding Techniques

In order to evaluate this algorithm, 25 gray scale images (available on CD) of selected NASA space missions (Galileo, Shoemaker-NEAR, Voyager, Mars Reconnaissance Orbiter, Mars Exploration Rovers A and B) were subjected to the described 8-bit to 3-bit compression algorithm.

The Peak Signal to Noise Ratio (PSNR) values of the encoded images were computed using the original bitmap images as the reference, and were calculated according to the equations in FIG. 8. For this particular set of sample images, where m=8 and n=3, a 62.5% reduction in information content yielded an average PSNR of 31.79 dB [25.30 dB, 39.02].

This algorithm can be expanded to work with any number of bits per data element. FIG. 7 shows the bits assignments for such data element configurations, as well as compression ratios. Across the bottom of FIG. 7, the compression ratios of utilizing n-bit codewords for an m-bit image is listed, as well as the compression ratios of utilizing 3-bit codewords for a m-bit image. Utilizing 3-bit codewords is the equivalent of keeping only the 8 most significant bits in an m-bit image (as in image compression), and encoding it as described in the 8-bit examples discussed thus far.

Additionally, the encoded values (powers of 2) in FIG. 7 are based on utilizing the individual bits of an m-bit image. There is no reason that these are the best values to encode. A survey of the histograms of past data sequences acquired might suggest that there are other value that would be better suited to encode. For the 8-bit to 3-bit example, 128, 32, 8, and 2 were chosen to encode as the values for differences. A survey of image histograms might indicate that the differences of 245, 74, 25, and 2 are the most likely to occur in space-acquired images, and therefore these might be better difference values to encode.

For further performance enhancement at the extreme ends of the range of DC values, the algorithm can employ integer arithmetic, and the compression and decompression algorithms can place hard stops at the value of zero and $2^n-1$. This has been shown to improve the PSNRs of the test images slightly (<1 dB), but at a cost of increased computational processing.

CONCLUSION

This algorithm can be utilized as an on-the-fly, non-probabilistic stand-alone compression, or as a probabilistic compression pre-processor. If used as the latter, a Huffman, Shannon-Fano or Arithmetic code could be applied to further reduce the bitstream.

When applied to images, this algorithm maintains PSNRs for most images at approximately 30 dB for all cases.

Its strength and uniqueness is in its simplicity, being non-computational and non-memory intensive, as well as in its compactness.

Although the description and example of the decoding and encoding steps of the algorithm as described in paragraphs [0033] through [0050] contain many specificities pertaining to the example of digital image compression, this should not be construed as limiting the scope of the invention but as merely providing illustration of some of the presently preferred embodiments of this invention. For example, the algorithm can be applied to the compression of numerical data, digitized sound waves, or digitized electronic signals. Thus the scope of the invention should be determined by the appended claims and their legal equivalents, rather than by the example given.

APPENDIX

INTERACTIVE DEVELOPMENT LANGUAGE COMPUTER PROGRAM LISTING
THAT PERFORMS THE COMPRESSION AND DECOMPRESSION OF BITMAP IMAGES
ACCORDING TO THE QUANTIZATION DIFFERENCING COMPRESSION ALGORITHM

```
Pro THREE_BIT_COMPRESSION_ALL_FORMATS_BYTE_ARITHMETIC_FOR_IDLVM
;
;
;**********EXAMPLE TEST PROGRAM *********
;Runs in IDL (Interactive Development Language) Environment
;
;Quantization Differencing Compression Algorithm
;
;3 bit compressions for image transmission
;Applicable to deep space mission transmission to Earth
;Compresses 8 bit, 0 to 255 grey level images to 3 bit
;Maximum inputimage size is 3000 x 3000 pixels
;Will convert RGB to Pan image
;Utilizes byte arithmetic
;Intended for image compression but will compress any data stream
;This program works on 8-bit word data only and must be modified to
;handle words of different sizes.
;
;
;Written and invented by Greg Gosian
;
;
;
;
;********** READ IN IMAGE AND CONVERT TO GRAY SCALE
;
Image        =   INTARR(3,3000,3000)
GrayScaleImage  =    INTARR(3000,3000)
Dummy1=DIALOG_READ_IMAGE(IMAGE=Image, GET_PATH=path)
print, path
ImageSize=SIZE(Image)
PRINT, IMAGESIZE
IF ImageSize(0) EQ 2 THEN BEGIN; determine if image is pan or color
    GrayScaleImage=Image
ENDIF ELSE BEGIN
;   Convert Image to Gray Scale
    GrayScaleImage = ROUND(FLOAT(0.299*FLOAT(REFORM(Image(0,*,*))) $
       + 0.587*FLOAT(REFORM(Image(1,*,*)))$
       + 0.114*FLOAT(REFORM(Image(2,*,*)))))
ENDELSE
GSImageSize=SIZE(GrayScaleImage)
;
;
;Display gray scale image
WINDOW,0,XSIZE=GSImageSize(1),YSIZE=GSImageSize(2), $
TITLE='Original Image'
TV, GrayScaleImage
;
;********** END READ IN IMAGE AND CONVERT TO GRAY SCALE
;
;
;
;
;
;++++++++++ CREATE COMPRESSION CODEWORD ARRAY
;
COMPRESSOR=INTARR(8)
COMPRESSOR=[-2,-8,-32,-128,2,8,32,128]
;
;++++++++++ END CREATE COMPRESSION CODEWORD ARRAY
;
;
;
;
;!!!!!!!!!! COMPRESS IMAGE
;
CompressedImage =   BYTARR(GSImageSize(1), GSImageSize(2))
Difference   =   BYTARR(8)
Tester    = BYTARR(8)
EncodedWord    =   BYTARR(3000,3000)
```

APPENDIX-continued

INTERACTIVE DEVELOPMENT LANGUAGE COMPUTER PROGRAM LISTING THAT PERFORMS THE COMPRESSION AND DECOMPRESSION OF BITMAP IMAGES ACCORDING TO THE QUANTIZATION DIFFERENCING COMPRESSION ALGORITHM

```
;
;Set first pixel in each row of compressed image to 127
CompressedImage(0,*)=127.
;
;Current pixel index: X,Y
;Previous pixel index: X-1,Y
FOR Y=0, GSImageSize(2)-1 DO BEGIN
   FOR X=1, GSImageSize(1)-2 DO BEGIN
;
;    Analyze image against each codeword value
      FOR I=0,7 DO BEGIN; Indexing for 8 codewords
;        Create array - Compressed image's previous pixel DC plus
;              available codeword values
         Tester(I)=BYTE(CompressedImage(X-1,Y)+Compressor(I))
;
;        Create array - differences of actual image's current pixel DC
;        and Compressed image's
;      previous pixel DC plus available codeword values
         Difference(I)=ABS(FIX(grayscaleImage(X,Y))-FIX(Tester(I)))
;
;        Find index of minimum difference between current pixel DC and
;        possible encoded pixel DC
;     Index is the index of the codeword that produces the best match
;                          - actual image DC and compressed image DC's
previous pixel
;                          plus the codeword
         MinimumDifference=MIN(Difference, Index)
      ENDFOR
;
;
;          create DC of current pixel
      DCcompressed=CompressedImage(X-1,Y)+Compressor(Index)
;
;
;    Create compressed pixel in compressed image
;          enter DC of current pixel in compressed image
      CompressedImage(X,Y)=DCCompressed
;
;    Record encoding for transmission
;    store index (0-7) of encoded word (encoded word is a 3-bit value,
;          stored here as a decimal value)
      EncodedWord(X,Y)=Index
;
;
   ENDFOR
ENDFOR
;
;!!!!!!!!!! END COMPRESS IMAGE
;
;
;
;
;
; ########## DISPLAY COMPRESSED AND DIFFERENCE IMAGES
;
WINDOW, 1,XSIZE=GSImageSize(1),YSIZE=GSImageSize(2), $
        TITLE='Compressed Image'
TV, CompressedImage; Compressed image
;
WINDOW, 2,XSIZE=GSImageSize(1),YSIZE=GSImageSize(2), $
    TITLE='Difference between Original and Compressed Image +127'
;
;
;IMDIFF=BYTE((FLOAT(CompressedImage)-FLOAT(grayscaleImage))+127.)
IMDIFF=BYTE(((CompressedImage)-(grayscaleImage))+127.)
FOR I1=0,255 DO BEGIN
   FOR I2=0,7 DO BEGIN
      IMDIFF(I1,I2)=I1
   ENDFOR
ENDFOR
TV, IMDIFF; Difference image
;
WINDOW, 5, XSIZE=500, YSIZE=500, TITLE='Histogram of Difference Image'
HIST=HISTOGRAM(IMDIFF)
XIND=INDGEN(256)
Y=HISTOGRAM(IMDIFF)
```

APPENDIX-continued

INTERACTIVE DEVELOPMENT LANGUAGE COMPUTER PROGRAM LISTING
THAT PERFORMS THE COMPRESSION AND DECOMPRESSION OF BITMAP IMAGES
ACCORDING TO THE QUANTIZATION DIFFERENCING COMPRESSION ALGORITHM

```
PLOT,XIND,Y
OUTPLOT=TVRD( )
;
;########## END DISPLAY COMPRESSED AND DIFFERENCE IMAGES
;
;
;
;
;
;
;@@@@@@@@@ ASSEMBLE IMAGE FROM ENCODED WORD ARRAY
;
Assem=BYTARR(GSImageSize(1),GSImageSize(2))
Assem(0,*)=127.; set first DC value in each column at 127
FOR Y=0, GSImageSize(2)-1 DO BEGIN
    FOR X=1, GSImageSize(1)-2 DO BEGIN
        Assem(X,Y)=Assem(X-1,Y)+Compressor(EncodedWord(X,Y))
    ENDFOR
ENDFOR
;
;Display assembled image and difference between it and compressed image
WINDOW, 3,XSIZE=GSImageSize(1),YSIZE=GSImageSize(2), $
        TITLE='Image assembled at receiver'
TV, Assem
;
;
;
;
;   Output the images
    WRITE_BMP, path+'Original_Image_in_GrayScale.bmp', GrayScaleImage
    WRITE_BMP, path+'Image_Reconstructed_from_codebook.bmp', Assem
    WRITE_BMP, path+'Histogram_of_difference.bmp', OUTPLOT
;
;@@@@@@@@@ END ASSEMBLE IMAGE FROM ENCODED WORD ARRAY
;
;
;
;^^^^^^^ ANALYSIS
;
;****************************************************************************
;
;PSNR
numberLevels=2^8
    imageA = REFORM( GrayScaleImage )
    imageB = REFORM( Assem )
    dimensions = SIZE( imageA, /DIMENSIONS )
    numberSamples = dimensions[0]
    numberLines = dimensions[1]
    dimensions = SIZE( imageB, /DIMENSIONS )
    IF ( (numberSamples NE dimensions[0]) OR $
        (numberLines NE dimensions[1]) ) THEN BEGIN
    PRINT, '% Provided images not the same dimensions: PSNR. Returning.'
        print,size(image1)
        print, size(image2)
    ENDIF
    ratio = 10D * ALOG10( DOUBLE( numberLevels )^2 / $
            ( TOTAL( ( DOUBLE( imageA ) - $
                DOUBLE( imageB ) )^2 ) / $
              (numberLines * numberSamples) ) )
    print, 'PSNR', ratio
;
;
;^^^^^^^ END ANALYSIS
;
;STOP
END
```

I claim:

1. A method for approximating sequentially presented numbers (data elements) so that the total amount of information required to approximate the original sequence is less than the total amount of original information, where:
   i. such data elements ranging from greater than or equal to 0, to less than or equal to $2^m-1$, where m is a positive integer greater than 1, and
   ii. such individual data elements are represented by a base-2 number consisting of no more than m-bits, and
   iii. the numerical values of the difference between the nth to the n+1th words (n>1) are represented by values ranging from $-(2^m-1)$ to $+(2^m-1)$, comprising the following steps:
      a. a codebook consisting of a limited set of numbers ranging from $-(2^m-1)$ to $+(2^m-1)$ is created and the values of the numbers in the codebook are associated with a binary code word, such code word consisting of p bits, and subject to p<m, and
      b. an approximation to the sequence of original data elements (m-bit words) is created by using a computer and by:
         i. assigning the value of the first data element in the approximation sequence $2^{m-1}-1$, and
         ii. constructing the next and each successive data element in the approximation sequence by summing the current data element value in the approximation sequence with one of the available codebook values, such codebook value chosen so that the sum representing the nth data value in the approximation sequence most closely matches the nth data element value in the original sequence, subject to the sum being greater than or equal to 0 and less than or equal to $2^m-1$, and
         iii. the value of the first data element and the ordered sequence of codewords are stored as a representation of the original sequence of numbers, and
      the reconstruction of the approximation sequence is accomplished by placing the value of $2^{m-1}-1$ in the first data element position, and each successive data element is reconstructed by adding the numerical value associated with that particular data element's codeword, to the previous numerical value of the approximation sequence.

2. The approximation method as recited in claim 1 wherein the method is applied to compressing electronically captured image pixel digital count data in a lossy manner for storage, by repeated application of the approximation algorithm as recited in claim 1, on each row of pixel digital count.

3. The approximation method as recited in claim 1 wherein the method is applied to compressing electronically captured hyperspectral image pixel digital count data in a lossy manner for storage, by repeated application of the approximation algorithm as recited in claim 1, on each row of pixel digital count, and across each frame of the hyperspectral data cube.

4. The approximation method as recited in claim 1 wherein the method is applied to compressing electronically captured image pixel digital count data in a lossy manner for transmission, by repeated application of the approximation algorithm as recited in claim 1, on each row of pixel digital count, and by the sharing of said codebook between the transmitter and the receiver for the purpose of image reconstruction.

5. The approximation method as recited in claim 1 wherein the method is applied to compress image data in a lossy manner, as a pre-processing step, prior to implementing a subsequent lossy or lossless data compression algorithm.

* * * * *